(12) United States Patent
Kim

(10) Patent No.: US 7,656,650 B2
(45) Date of Patent: Feb. 2, 2010

(54) MODULAR PRINTED BOARD ASSEMBLY, PLASMA DISPLAY APPARATUS HAVING THE SAME, AND METHOD OF FABRICATING THE ASSEMBLY

(75) Inventor: Yeung-Ki Kim, Suwon-si (KR)

(73) Assignee: Samsung SDI Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 657 days.

(21) Appl. No.: 11/207,884

(22) Filed: Aug. 22, 2005

(65) Prior Publication Data

US 2006/0077628 A1    Apr. 13, 2006

(30) Foreign Application Priority Data

Oct. 13, 2004    (KR) .................. 10-2004-0081756

(51) Int. Cl.
*G06F 1/16*    (2006.01)
(52) U.S. Cl. .................. 361/679; 361/681; 361/752; 313/584
(58) Field of Classification Search .................. 313/582, 313/584; 361/679, 681, 748, 752
See application file for complete search history.

(56) References Cited

U.S. PATENT DOCUMENTS 6,771,517 B2 *  8/2004  Crapisi et al. ............... 361/829
2004/0232838 A1 * 11/2004  Masuda et al. ............. 313/582

FOREIGN PATENT DOCUMENTS

JP    2002-116710    4/2002

OTHER PUBLICATIONS

Office Action from the Japanese Patent Office issued in Applicant's corresponding Japanese Patent Application No. 2005-170738 dated Nov. 6, 2007.

* cited by examiner

*Primary Examiner*—David Hung Vu
(74) *Attorney, Agent, or Firm*—Robert E. Bushnell, Esq.

(57) ABSTRACT

In a modular printed board assembly, a plasma display apparatus including the modular printed board assembly, and a method of fabricating the modular printed board assembly, the modular printed board includes: a frame of plate shape fixed on a chassis base; and a plurality of printed board assemblies, on which a plurality of electronic elements are mounted, installed on the frame.

15 Claims, 2 Drawing Sheets

MODULAR PRINTED BOARD ASSEMBLY, PLASMA DISPLAY APPARATUS HAVING THE SAME, AND METHOD OF FABRICATING THE ASSEMBLY

CLAIM OF PRIORITY

This application makes reference to, and incorporates the same herein, and claims all benefits accruing under 35 U.S.C. § 119 from an application for MODULAR PRINTED BOARD ASSEMBLY, PLASMA DISPLAY APPARATUS HAVING THE SAME, AND METHOD OF FABRICATING THE ASSEMBLY earlier filed in the Korean Intellectual Property Office on the 13 of Oct. 2004 and there duly assigned Serial No. 10-2004-0081756.

BACKGROUND OF THE INVENTION

1. Technical Field

The present invention relates to a modular printed board assembly for a plasma display apparatus, a plasma display apparatus including the same, and a method of fabricating the printed board assembly. More particularly, the present invention relates to a printed board assembly modulated by being mounted on a frame, and a plasma display apparatus including the printed board assembly.

2. Related Art

A plasma display apparatus is a flat panel display that displays images using a gas discharge phenomenon, and is highlighted as a next generation flat panel display that can substitute for the cathode ray tube (CRT) since it has excellent display characteristics, such as display capacity, brightness, contrast, residual image, and viewing angle. The plasma display apparatus comprises a plasma display panel which includes glass substrates, and a chassis base supporting the plasma display panel.

The plasma display panel of the plasma display apparatus includes a front substrate, a rear substrate, and a thermal conductive sheet attached to a rear surface of the rear substrate. The plasma display panel is supported by the chassis base which is formed of a metal such as aluminum. The plasma display panel is attached to a front surface of the chassis base using a dual-adhesive tape.

Printed board assemblies are installed on a back surface of the chassis base, and the printed board assemblies are separated from the chassis base by a stud mounted on the surface of the chassis base. Various electronic components are disposed on the printed board assemblies. A signal transmission cable connects electrodes, disposed on the front substrate or the rear substrate, with connectors disposed on the printed board assemblies. The components are installed in a case.

Since a plurality of printed board assemblies are directly mounted on the rear surface of the chassis base in the plasma display apparatus, processing time for mounting the printed board assemblies onto the chassis base increases. In particular, the printed board assemblies are fixed onto the stud which is fixed on the chassis base using screws, and thus, the number of screws increases when the number of printed board assemblies increases. Accordingly, the processing time also increases, and thus, productivity is lowered and the cost of fabricating the apparatus also increases.

SUMMARY OF THE INVENTION

The present invention provides a modular printed board assembly for a plasma display apparatus, a plasma display apparatus which includes the modular printed board assembly, and a method of fabricating the modular printed board assembly.

According to an aspect of the present invention, a modular printed board assembly comprises: a frame of plate shape fixed on a chassis base; and a plurality of printed board assemblies installed on the frame, a plurality of electronic elements being mounted on the printed board assemblies.

According to another aspect of the present invention, a plasma display apparatus comprises: a plasma display panel including a front substrate and a rear substrate; a chassis base disposed on a rear surface of the plasma display panel; a frame of plate shape fixed on the chassis base; and a plurality of printed board assemblies installed on the frame, a plurality of electronic elements being mounted on the printed board assemblies.

According to another aspect of the present invention, a method of fabricating a plasma display apparatus comprises the steps of: mounting a plurality of printed board assemblies on a frame of plate shape; mounting a plurality of electronic elements on the printed board assemblies; and fixing the frame on a chassis base of the plasma display apparatus.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
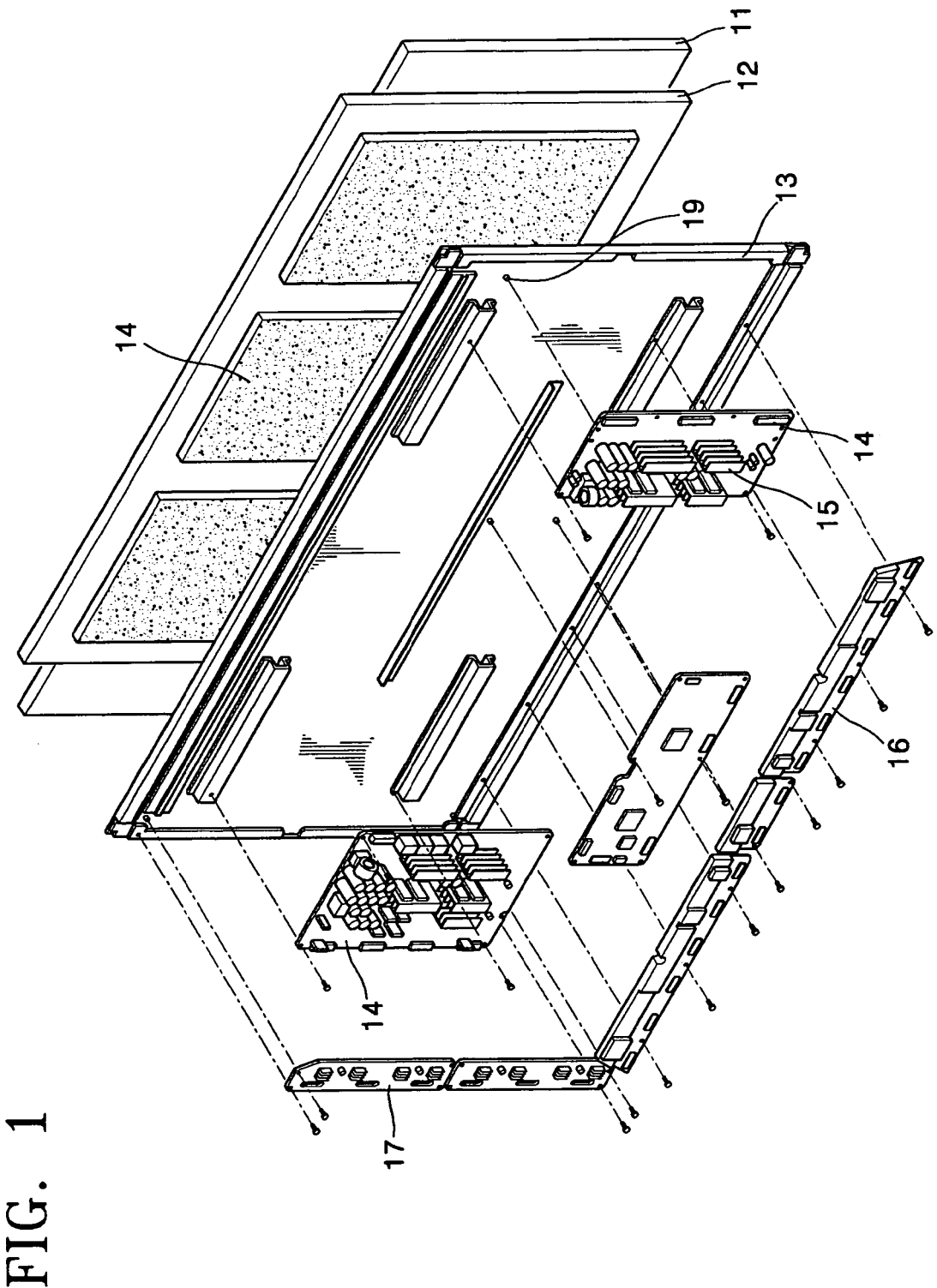
FIG. 1 is a schematic perspective view of a plasma display apparatus.

FIG. 1 is a schematic perspective view of a plasma display apparatus.

Referring to FIG. 1, the plasma display panel of the plasma display apparatus includes a front substrate 11 and a rear substrate 12, and a thermal conductive sheet 14 is attached to a rear surface of the rear substrate 12. The plasma display panel is supported by a chassis base 13 which is formed of a metal such as aluminum. The plasma display panel is attached to a front surface of the chassis base 13 using a dual-adhesive tape (not shown).

Printed board assemblies 14, 16 and 17 are installed on a rear surface of the chassis base 13, and the printed board assemblies 14, 16 and 17 are separated from the chassis base 13 by a stud 19 mounted on the rear surface of the chassis base 13. Various electronic components 15 are disposed on the printed board assemblies 14, 16 and 17. Reference numerals 16 and 17 denote buffer printed board assemblies, and a signal transmission cable (not shown) connects electrodes disposed on the front substrate 11 or the rear substrate 12 with connectors (not shown) disposed on the buffer printed board assemblies 16 and 17. The components of FIG. 1 are installed in a case (not shown).

Since the printed board assemblies 14 are directly mounted on the rear surface of the chassis base 13 in the plasma display apparatus of FIG. 1, processing time for mounting the printed board assemblies 14 on the chassis base 13 increases. In particular, the printed board assemblies 14 are fixed onto the stud 19 that is fixed on the chassis base 13 using screws. Thus, the number of screws increases when the number of printed board assemblies 14 increases. Accordingly, the processing time also increases, and thus productivity is lowered and the cost of fabricating the apparatus also increases.

Figure 2:
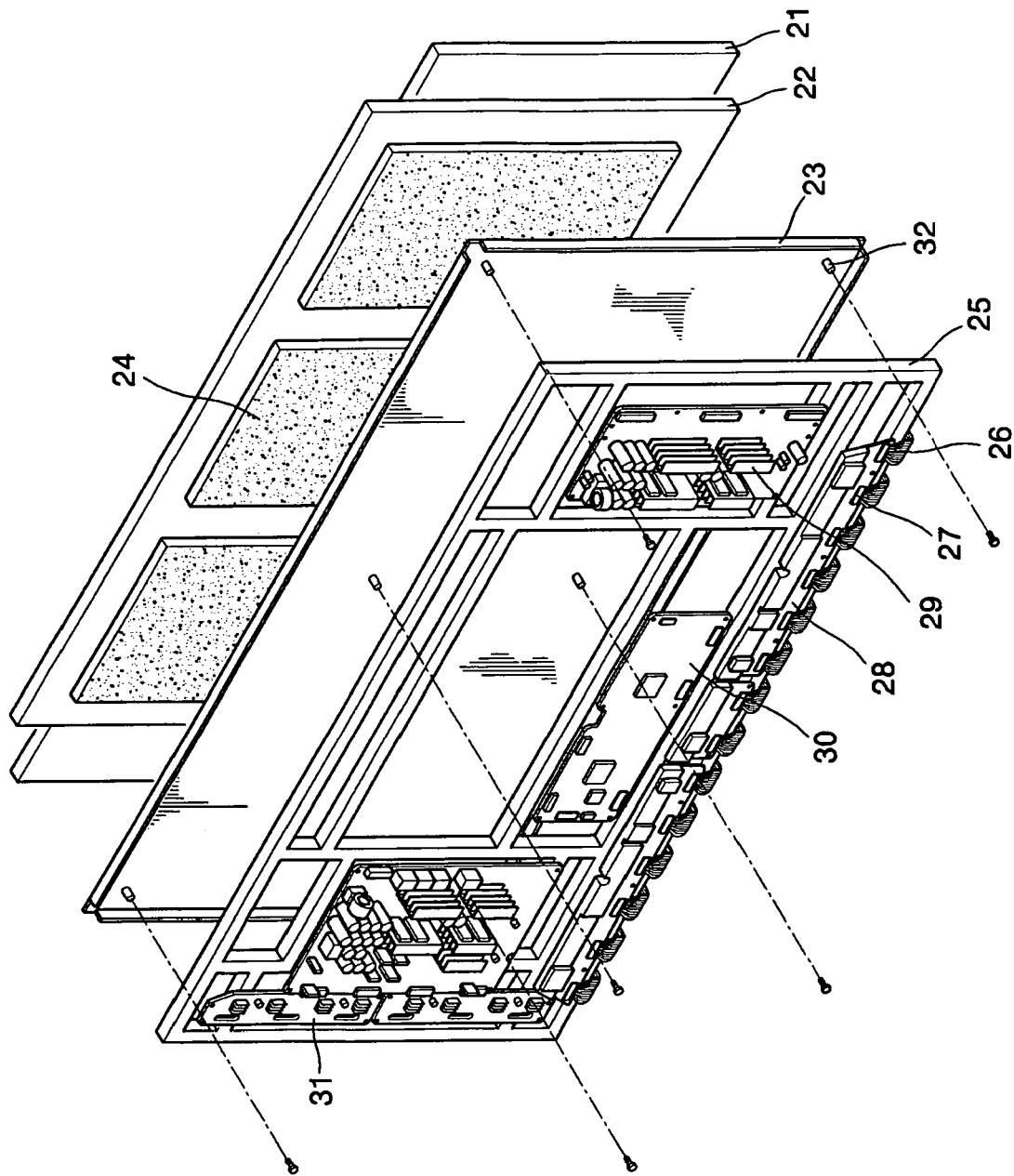
FIG. 2 is a schematic perspective view of a plasma display apparatus according to the present invention.

FIG. 2 is a schematic exploded perspective view of a plasma display apparatus according to the present invention.

Referring to FIG. 2, the plasma display apparatus comprises a plasma display panel which includes a front substrate 21 and a rear substrate 22, and a thermal conductive sheet 24 is attached to a rear surface of the rear substrate 22. The plasma display panel is supported by a chassis base 23 formed of a metal material such as aluminum. The plasma display panel is attached on a front surface of the chassis base 23 using a dual-adhesive tape (not shown).

A frame 25, on which a plurality of printed board assemblies 28, 30 and 31 are mounted, is installed on a rear surface of the chassis base 23. It is desirable that the frame 25 be formed of plastic in the shape of a plate. In addition, it is desirable that the frame 25 be supported so as to be separated from the chassis base 23 by studs 32.

The printed board assemblies 28, 30 and 31 are mounted on the frame 25. Reference numerals 28 and 31 denote buffer printed board assemblies, and signal transmission cables 26 connect electrodes formed on the front substrate 21 or the rear substrate 22 to connectors 27 disposed on the buffer printed board assemblies 28 and 31. The connectors 27 are installed on the buffer printed board assemblies 28 and 31, and the signal transmission cables 26 are connected to the connectors 27. Each of the signal transmission cables 26 is connected to electrodes formed on the inner surface of the rear substrate 22. Other signal transmission cables (not shown) are connected to the front substrate 21. A plurality of various types of electronic elements 29 for driving the plasma display apparatus are mounted on the other printed board assembly 30. The substrates 21 and 22, the chassis base 23, the frame 25, and the printed board assemblies 28, 30 and 31 mounted on the frame 25 are installed in a case (not shown) so as to form the plasma display apparatus.

As described above, the frame 25 and the printed board assemblies 28, 30 and 31 are provided in one module. That is, before assembling the frame 25 on the chassis base 23, the printed board assemblies 28, 30 and 31 are all mounted on the frame 25, and thus a modular printed board assembly for the plasma display apparatus is formed. The modular printed board assembly includes the frame 25 and the printed board assemblies 28, 30 and 31, on which a plurality of electronic elements 29 are mounted, disposed on the frame 25.

When the modular printed board assembly is used, the process of assembling each printed board assembly separately onto the chassis base 23 can be omitted, and thus the fabrication process of the plasma display apparatus can be simplified and performed rapidly. Since the process for assembling each of the printed board assemblies 28, 30 and 31 onto the chassis base 23 requires manual work on the part of the assembler, the entire operation tends to be slow. However, the process for mounting each of the printed board assemblies 28, 30 and 31 onto the frame 25 may be carried out in various ways, so that a number of options are provided. For example, the printed board assemblies 28, 30 and 31 can be mounted on the frame 25 by welding, using adhesive, using dual-adhesive tape, and screwing.

According to the present invention, the module that is formed by mounting the printed board assemblies on the frame is used, and thus the assembly process can be simplified and can be performed rapidly.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A modular printed board assembly for use in a plasma display apparatus which comprises a plasma display panel including a front substrate and a rear substrate, a thermal conductive sheet disposed on a rear surface of the rear substrate, and a chassis base disposed directly adjacent to, and in contact with, the thermal conductive sheet and the rear surface of the rear substrate, said modular printed board assembly comprising:

a frame of plate shape fixed on a rear surface of the chassis base; and a plurality of printed board assemblies installed on the frame, a plurality of electronic elements being mounted on the printed board assemblies.

2. The modular printed board assembly of claim 1, further comprising at least one stud for interconnecting, and maintaining a separation between, the frame and the chassis base.

3. The modular printed board assembly of claim 1, wherein the frame is made of plastic.

4. The modular printed board assembly of claim 1, wherein the printed board assemblies comprises buffer printed board assemblies.

5. The modular printed board assembly of claim 4, further comprising signal transmission cables which connect electrodes on a front substrate of a plasma display panel to connectors on the buffer printed based assemblies.

6. A plasma display apparatus, comprising:

a plasma display panel including a front substrate and a rear substrate;

a thermal conductive sheet disposed on a rear surface of the rear substrate;

a chassis base disposed directly adjacent to, and in contact with, the thermal conductive sheet and the rear surface of the rear substrate;

a frame of plate shape fixed on a rear surface of the chassis base; and a plurality of printed board assemblies installed on the frame, a plurality of electronic elements being mounted on the printed board assemblies.

7. The plasma display apparatus of claim 6, further comprising at least one stud for interconnecting, and maintaining a separation between, the frame and the chassis base.

8. The plasma display apparatus of claim 6, wherein the frame is made of plastic.

9. The plasma display apparatus of claim 6, wherein the printed board assemblies comprises buffer printed board assemblies.

10. The plasma display apparatus of claim 6, further comprising signal transmission cables which connect electrodes on the front substrate of the plasma display panel to connectors on the buffer printed based assemblies.

11. A method of fabricating a plasma display apparatus, comprising the steps of:

providing a plasma display panel including a front substrate and a rear substrate;

disposing a thermal conductive sheet on a rear surface of the rear substrate;

disposing a chassis base directly adjacent to, and in contact with, the thermal conductive sheet and the rear surface of the rear substrate;

providing a plurality of printed board assemblies;

mounting a plurality of electronic elements on the printed board assemblies;
providing a frame of plate shape;
mounting the printed board assemblies on the frame; and
fixing the frame on a rear surface of the chassis base.

12. The method of claim 11, further comprising the step of providing at least one stud for interconnecting, and maintaining a separation between, the frame and the chassis base.

13. The method of claim 11, further comprising the step of fabricating the frame of plastic.

14. The method of claim 11, wherein the printed board assemblies comprises buffer printed board assemblies.

15. The method of claim 14, further comprising the steps of providing signal transmission cables, and interconnecting electrodes on a front substrate of a plasma display panel to connectors on the buffer printed board assemblies using the signal transmission cables.

* * * * *